(12) United States Patent
Liu et al.

(10) Patent No.: US 7,348,625 B2
(45) Date of Patent: Mar. 25, 2008

(54) SEMICONDUCTOR DEVICE AND METHOD OF MANUFACTURING THE SAME

(75) Inventors: Mu-Yi Liu, Taichung (TW); Tao-Cheng Lu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 46 days.

(21) Appl. No.: 11/194,545

(22) Filed: Aug. 2, 2005

(65) Prior Publication Data
US 2006/0033149 A1 Feb. 16, 2006

Related U.S. Application Data

(60) Provisional application No. 60/600,392, filed on Aug. 11, 2004.

(51) Int. Cl.
*H01L 29/788* (2006.01)
(52) U.S. Cl. .................................. 257/315; 257/321
(58) Field of Classification Search ................ 257/315, 257/321
See application file for complete search history.

(56) References Cited

U.S. PATENT DOCUMENTS

| | | | |
|---|---|---|---|
| 6,727,136 B1 | 4/2004 | Buller et al. | |
| 6,737,324 B2 | 5/2004 | Chang | |
| 6,753,232 B2 | 6/2004 | Kwak et al. | |
| 6,878,988 B1* | 4/2005 | Lee et al. | 257/324 |
| 7,015,540 B2* | 3/2006 | Ishii et al. | 257/322 |
| 2005/0051832 A1* | 3/2005 | Fukumura et al. | 257/314 |

OTHER PUBLICATIONS

Y. Sasago et al., "90-nm-node multi-level AG-AND type flash memory with cell size of true 2 $F^2$/bit and programming throughput of 10MB/s," IEEE, 2003, pp. 34.2.1-34.2.4.

* cited by examiner

*Primary Examiner*—Van Thu Nguyen
*Assistant Examiner*—Allison P Bernstein
(74) *Attorney, Agent, or Firm*—Finnegan, Henderson, Farabow, Garrett & Dunner LLP

(57) ABSTRACT

An EEPROM cell includes first and second assist gates on opposite sides of a charge retaining insulating layer. Current in the EEPROM memory cell flows between inversion layers, which are created in response to a bias applied to the assist gates. The insulating layer can include silicon nitride, which is provided between layers of silicon dioxide above the channel region, such that these layers can constitute a dielectric stack, which can be fabricated to occupy a relatively small area.

18 Claims, 11 Drawing Sheets

SEMICONDUCTOR DEVICE AND METHOD OF MANUFACTURING THE SAME

CROSS REFERENCE TO RELATED APPLICATION

This application is based upon and claims the benefit of U.S. Provisional Application No. 60/600,392 to Mu-Yi LIU et al. filed Aug. 11, 2004, the entire contents of which are incorporated herein by reference.

TECHNICAL FIELD

The present invention relates in general to a semiconductor device and a method for forming a semiconductor device. More specifically, the present invention relates to a flash EEPROM cell and related methods of fabrication and operation.

BACKGROUND INFORMATION

A conventional flash EEPROM memory cell typically includes spaced source and drain regions diffused into a semiconductor substrate and a channel region provided therebetween. In addition, the conventional flash memory cell includes an electrically isolated floating gate provided over the channel region, and a control gate disposed above the floating gate. By applying appropriate voltages to the source, drain and control gate, charge is either stored on or removed from the floating gate, and thus data, in the form of such charge, is stored in, or erased from, the memory cell. The presence or absence of charge on the floating gate determines whether current flows between the source and drain regions when the memory cell is selected. Such current can be sensed by appropriate circuitry as a binary "1" stored in the memory cell. Alternatively, if no current is sensed, a binary "0" may assumed to be stored in the memory cell.

When the memory cell is deselected, however, little or no current should flow in the channel region of the memory cell.

In order to improve memory cell density, flash memory cells have been aggressively scaled downward. As a result, the channel length, i.e., the distance between the diffused source and drain regions, has been substantially reduced. Memory cells having a reduced size, however, can suffer from so-called "short channel effects." In particular, as the channel region decreases in size, pn junction depletion regions formed about the source and drain regions can create relatively strong electric fields such that the current flowing through the cell is not controlled by biases applied to the control gate and the presence/absence of charge on the floating gate. Rather, the current is determined primarily by the voltage across the source and drain regions. As a result, for a given source and drain voltage, an excessively high current may flow in a deselected memory cell resulting in memory read out errors.

The present invention is directed to overcome one or more of the problems of the prior art.

SUMMARY OF THE INVENTION

Consistent with an aspect of the present invention, a semiconductor device is provided which comprises a semiconductor substrate having a surface, and a first conductive layer provided on a first region of the semiconductor substrate. The first conductive layer is insulated from the first region of the semiconductor substrate. The semiconductor device also includes a second conductive layer provided on a second region of the semiconductor substrate, such that the first region and the second region are spaced from one another. The second conductive layer is insulated from the second region of the semiconductor substrate. The semiconductor device further includes an insulating layer provided on a third region of the semiconductor substrate between the first and second regions. In addition, the semiconductor device includes a third conductive layer provided on the insulating layer, wherein upon application of first, second, and third biases to the first, second, and third conductive layers, respectively, the insulating layer receives and retains carriers.

Consistent with another aspect of the present invention, a semiconductor device is provided which comprises a substrate, and a dielectric stack provided on the substrate and configured to retain charge. The dielectric stack includes a first layer of silicon oxide, a second layer of silicon nitride, and a third layer of silicon oxide. The semiconductor device also includes a first polysilicon layer laterally spaced from the dielectric stack and insulated from the substrate, as well as a second polysilicon layer laterally spaced from the dielectric stack and the first polysilicon layer. The second polysilicon layer is insulated from the substrate. The semiconductor device further includes a third polysilicon layer provided on the third silicon dioxide layer, the first polysilicon layer and the second polysilicon layer. The third polysilicon layer is insulated from the first and second polysilicon layers.

Consistent with a further aspect of the present invention, a semiconductor device is provided which comprises a semiconductor substrate, first and second assist gate lines, an insulating layer, and a word line. The semiconductor substrate has a surface and the first assist gate line is insulated from and extends over a first region of the surface of the semiconductor substrate. The second assist gate line is insulated from and extends over a second region of the surface of the semiconductor substrate. The first and second regions of the surface of the substrate are spaced from one another. The insulating layer is provided on a third region of the surface of the semiconductor substrate between the first and second regions, and a word line is provided on the insulating layer. Upon application of first, second, and third biases to the first assist gate line, the second assist gate line, and the word line, respectively, the insulating layer receiving and retaining carriers. In addition, first and second inversion layers are formed adjacent to the first and second assist gate lines, respectively, in response to the first and second biases, and first and second doped regions provided in the semiconductor substrate, the first and second doped regions being configured to bias the first and second inversion layers, respectively.

Consistent with an additional aspect of the present invention, a method of fabricating a semiconductor device on a semiconductor substrate is provided which comprises forming a first insulating layer on a first region of the substrate surface, and forming a second insulating layer on the first insulating layer. The method also includes forming a third insulating layer on the substrate and the second insulating layer, as well forming a first conductive layer, on the third insulating layer, laterally spaced from the first and second insulating layers. In addition, the method includes forming a second conductive layer, on the third insulating layer, laterally spaced from the first and second insulating layers, forming a third conductive layer on the third insulating layer.

In accordance with another aspect of the present invention, a method for fabricating a semiconductor device is provided which comprises forming a dielectric stack on a substrate which includes a first layer of silicon oxide, a second layer of silicon nitride, and a third layer of silicon oxide. The method further includes forming a first polysilicon layer laterally spaced from the dielectric stack, and forming a second polysilicon layer laterally spaced from the dielectric stack. The method also includes oxidizing portions of the first and second polysilicon layers, and forming a third polysilicon layer on the dielectric stack and the oxidized portions of the first and second polysilicon layers.

Additional features and advantages of the invention will be set forth in the description that follows, being apparent from the description or learned by practice of the invention. The objectives and other advantages of the invention will be realized and attained by the semiconductor devices and methods of manufacture particularly pointed out in the written description and claims, as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention.

In the drawings.

DESCRIPTION OF THE EMBODIMENTS

Consistent with an aspect of the present invention, an EEPROM cell is provided having first and second assist gates provided on opposite sides of a charge retaining insulating layer. Current in a selected memory cell flows between inversion layers, which are created in response to a bias applied to the assist gates. Unlike diffused source and drain regions, the inversion layers do not form pn junctions, and thus strong electric fields are avoided. As a result, short channel effects are substantially reduced.

In addition, charge is stored within an insulating layer, instead of a polysilicon or other conductive layer. The insulating layer can include silicon nitride, which is provided between layers of silicon dioxide above the channel region. Collectively, these layers can constitute a dielectric stack, which can be fabricated to occupy a relatively small area.

Figure 1:
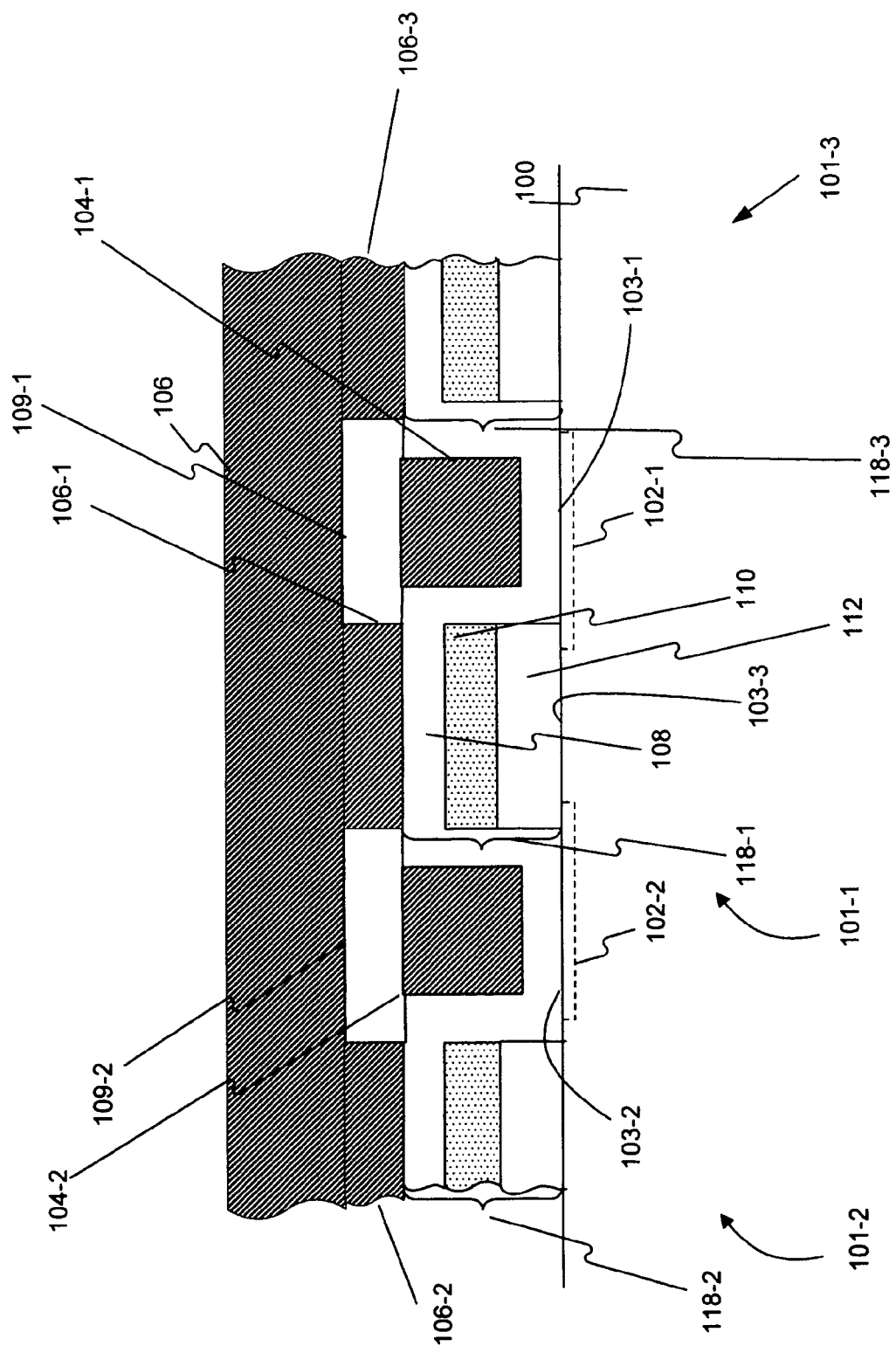
FIG. 1 illustrates a cross-sectional view of a memory cell consistent with an aspect of the present invention.

Reference will now be made in detail to embodiments of the present invention, examples of which are illustrated in the accompanying drawings. FIG. 1 illustrates a structure of a semiconductor device 101-1, such as an EEPROM memory cell, consistent with an embodiment of the present invention. Semiconductor device 101-1 includes a p-type semiconductor substrate 100, for example, upon which a first insulating layer 112, a second insulating layer 110, and a third insulating layer 108 are formed over a region 103-3 of the surface of substrate 100. The first (112) and third (108) insulating layers typically include a silicon oxide, such as silicon dioxide, and second insulating layer 110 typically includes silicon nitride. Layers 108, 110 and 112 can constitute a dielectric stack 118-1.

A first conductive layer or assist gate 104-1 is provided adjacent dielectric stack 118-1, and is insulated from and disposed above a region 103-1 of the surface of substrate 100. In addition, a second conductive layer or assist gate 104-2 is provided adjacent dielectric stack 118-1, and is insulated from and disposed above a region 103-2 of the surface of substrate 100. Both assist gates 104-1 and 104-2 typically include a conductive material, such as polysilicon. As further shown in FIG. 1, regions 103-1 and 103-2 are spaced from one another and adjacent to region 103-3, which is disposed therebetween. Fourth insulating layers 109-1 and 109-2 are formed on assist gates 104-1 and 104-2, respectively. A control gate layer 106-1 and a word line 106 are provided on insulating layers 109-1 and 109-2 and insulating layer 108. Control gate layer 106-1 and word line 106 are formed of a conductive material, such as polysilicon, and may constitute a contiguous conductive layer.

As discussed in greater detail below and consistent with an aspect of the present invention, memory cells are typically arranged in an array of rows and columns on substrate 100. Memory cell 101-1 can be one such memory cell provided in a row with other memory cells, such as memory cells 101-2 and 101-3 further shown in FIG. 1. Each memory cell in the array typically has the same or similar structure. For example, as shown in FIG. 1, adjacent memory cells 101-2 and 101-3 include dielectric stacks 118-2 and 118-3, respectively, as well as corresponding control gate layers 106-2 and 106-3.

Upon application of appropriate biases to assist gates 104-1 and 104-2, inversion layers 102-1 and 102-2 are respectively formed in regions 103-1 and 103-2 of the surface of substrate 100. In addition, upon further selectively biasing word line 106, and thus control gate 106-1, dielectric stack 118-1 can receive and retain charge. Such charge, or the absence thereof, constitutes stored data in device 101-1.

An exemplary method of fabricating device 101-1 will next be described with reference to FIGS. 2A-2E.

Figure 2A:
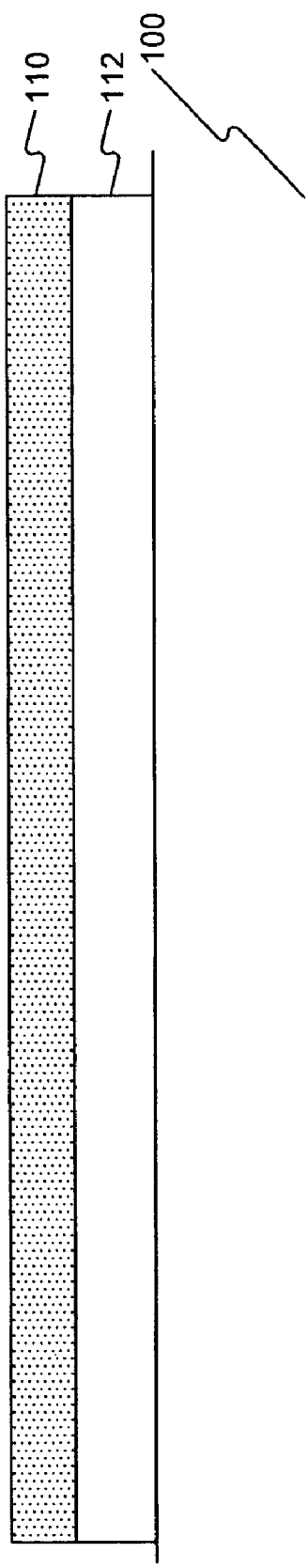
FIGS. 2A-2D illustrate a process for manufacturing a semiconductor device consistent with the present invention.

Referring to FIG. 2A, first insulating layer 112 and second insulating layer 110 are sequentially formed on semiconductor substrate 100. First insulating layer 112 includes, for example, silicon dioxide, which has been deposited or thermally grown, and second insulating layer 110 includes, for example, silicon nitride, which has been deposited or thermally grown. A photoresist pattern (not shown) is provided on second insulating layer 112, and then first insulation layer 112 and second insulating layer 110 are etched using known methods. The photoresist pattern is then removed.

Figure 2B:
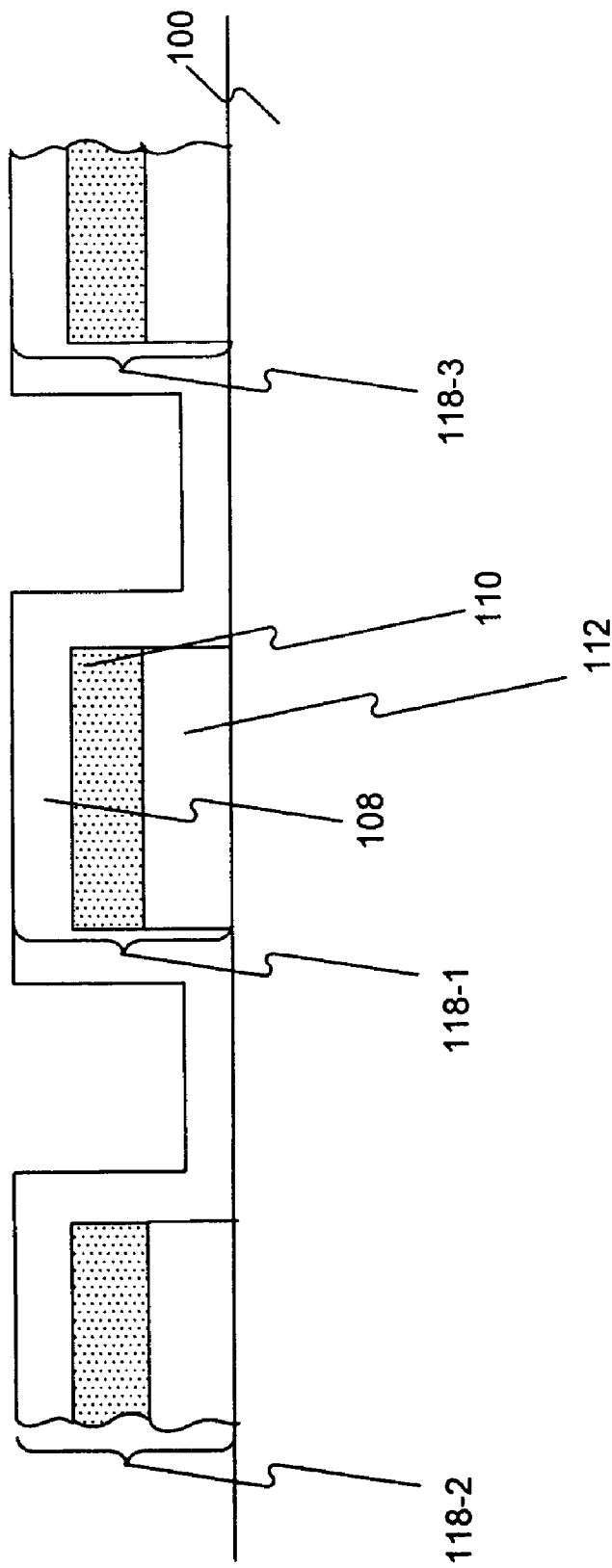

In FIG. 2B, third insulating layer 108 is then formed on substrate 100, including the etched first (112) and second (110) insulating layers. Third insulating layer 108 can include a silicon oxide, such as silicon dioxide, either thermally grown or deposited on substrate 100. Etched first (112) and second (110) insulating layers, and portions of third insulating layer 108 overlying the etched first (112) and second (110) insulating layers collectively constitute dielectric stacks 118-1, 118-2, and 118-3, in this case ONO dielectric stacks.

Figure 2C:
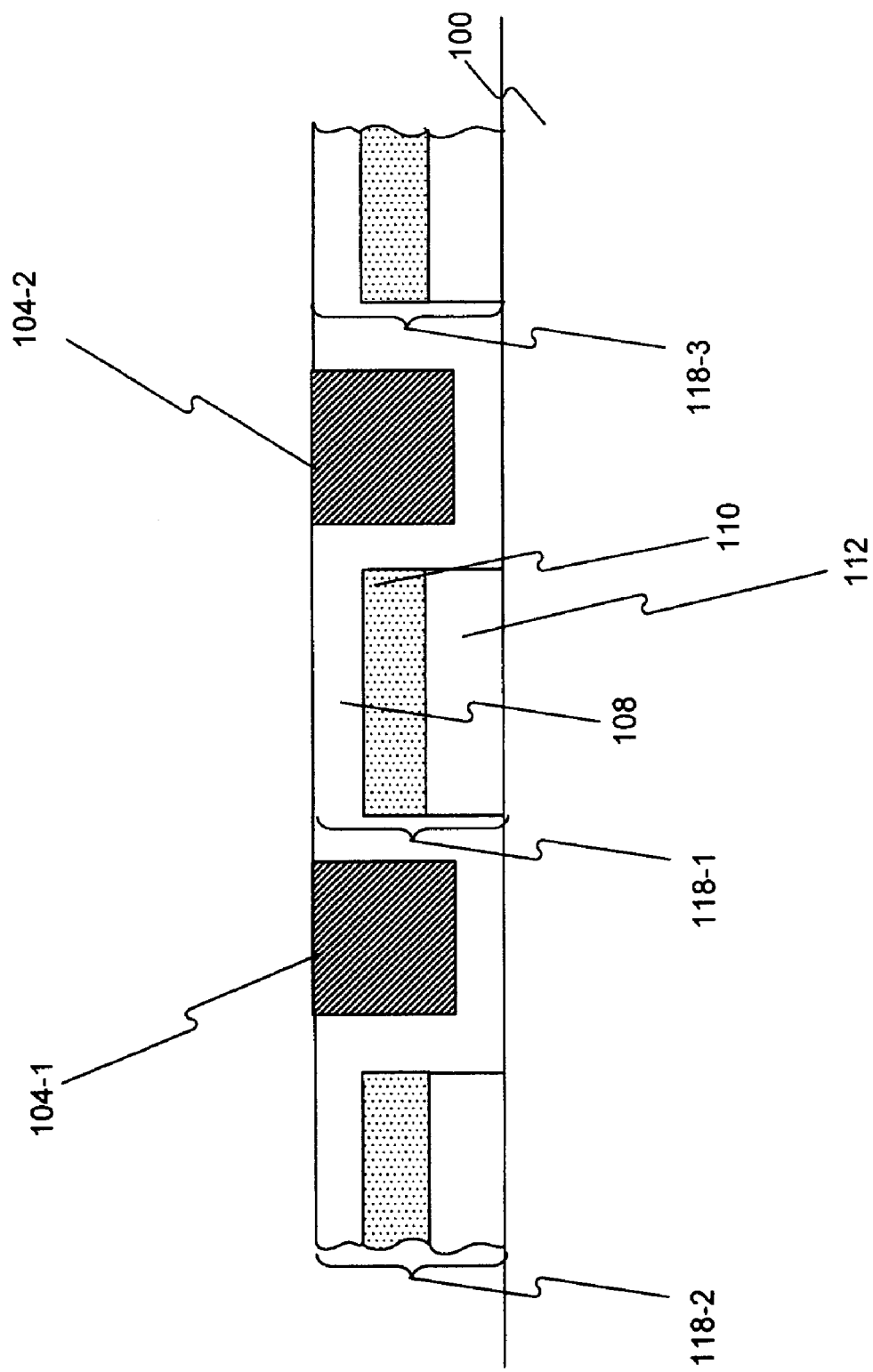

In FIG. 2C, a conductive material comprising, for example, polysilicon or a metal is deposited on third insulating layer 108 in a known manner. The conductive material is then patterned to form spaced conductive layers or assist gates 104-1 and 104-2 on opposite sides of dielectric stack 118-1. Assist gates 104-1 and 104-2 are then subjected to a known chemical mechanical polishing (CMP) technique so that a top portion of assist gates 104-1 and 104-2 are even with a top surface of the portion of insulating layer 108 above insulating layer 110.

Figure 2D:
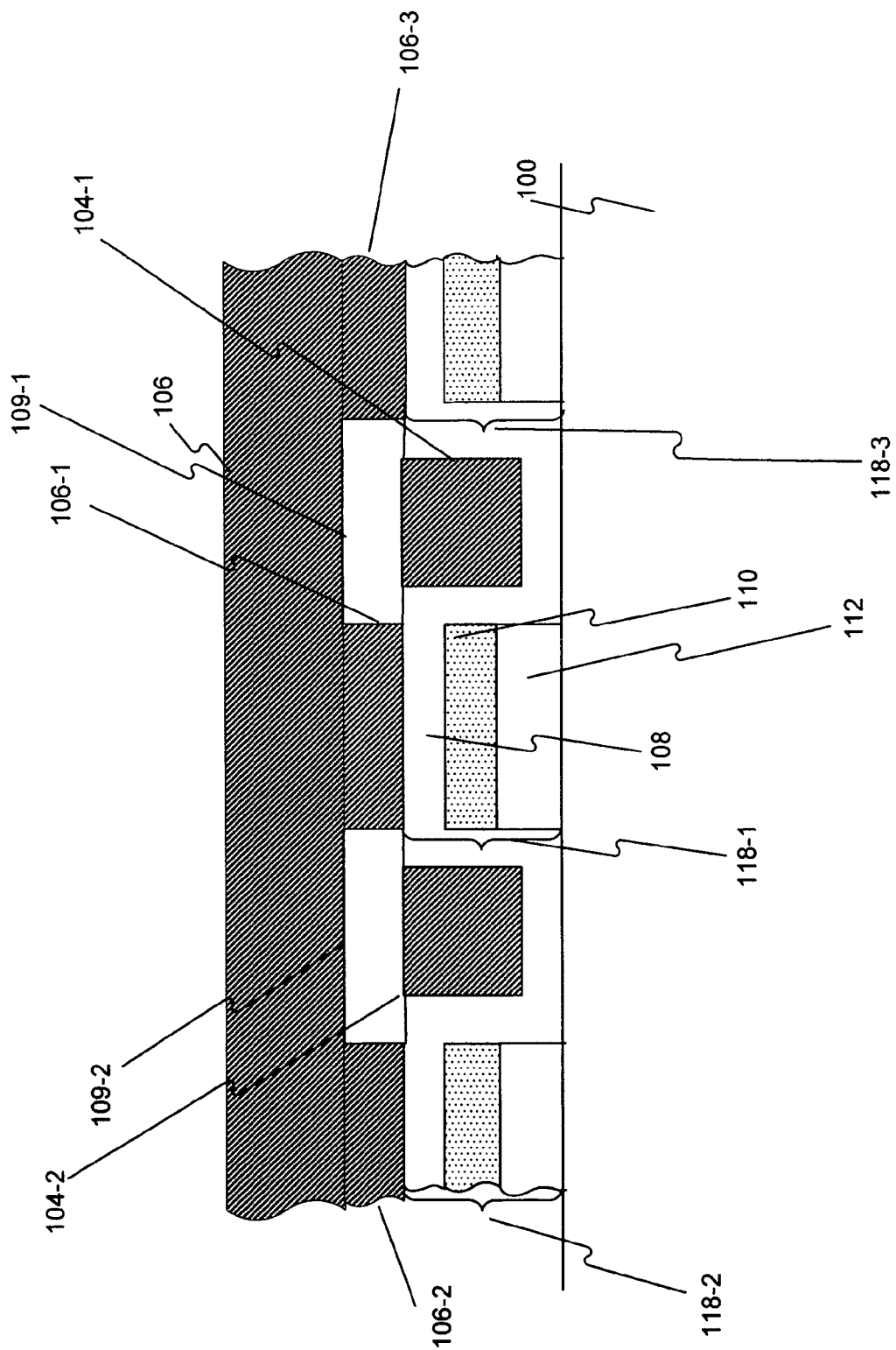

Next, in FIG. 2D, top portions of assist gates 104-1 and 104-2, if made of polysilicon, are subjected to a conventional oxidation process to form insulating layers 109-1 and 109-2. Otherwise, insulating layers 109-1 and 109-2 may be formed by other known techniques. A conductive layer, including, for example, polysilicon or other known conductors, is then deposited on dielectric stacks 118-1, 118-2, 118-3, as well as insulating layers 109-1 and 109-2. After appropriate photolithography and etching steps, the conductive layer is patterned to form word line 106 and control gate 106-1.

Figure 3A:
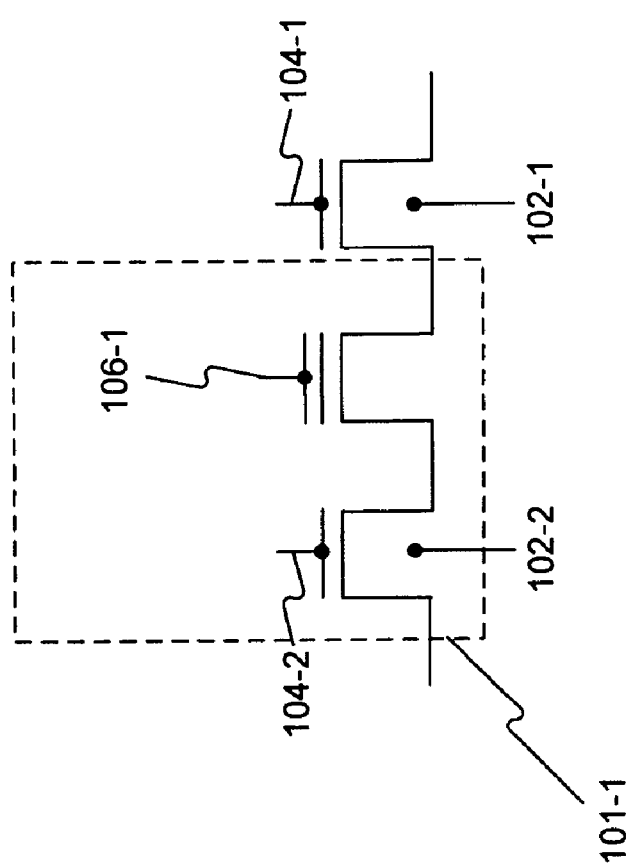
FIG. 3A illustrates a schematic diagram of a memory cell consistent with the present invention.

FIG. 3A illustrates a schematic representation of memory cell or device 101-1 consistent with the present embodiment. In particular, lines 104-1 and 104-2 represent corresponding assist gates 104-1 and 104-2 shown in FIG. 1, and lines 102-1 and 102-2 correspond to respective inversion layers 102-1 and 102-2 further shown in FIG. 1. In addition, line 106-1 represents control gate 106-1 also shown in FIG. 1.

Figure 3B:
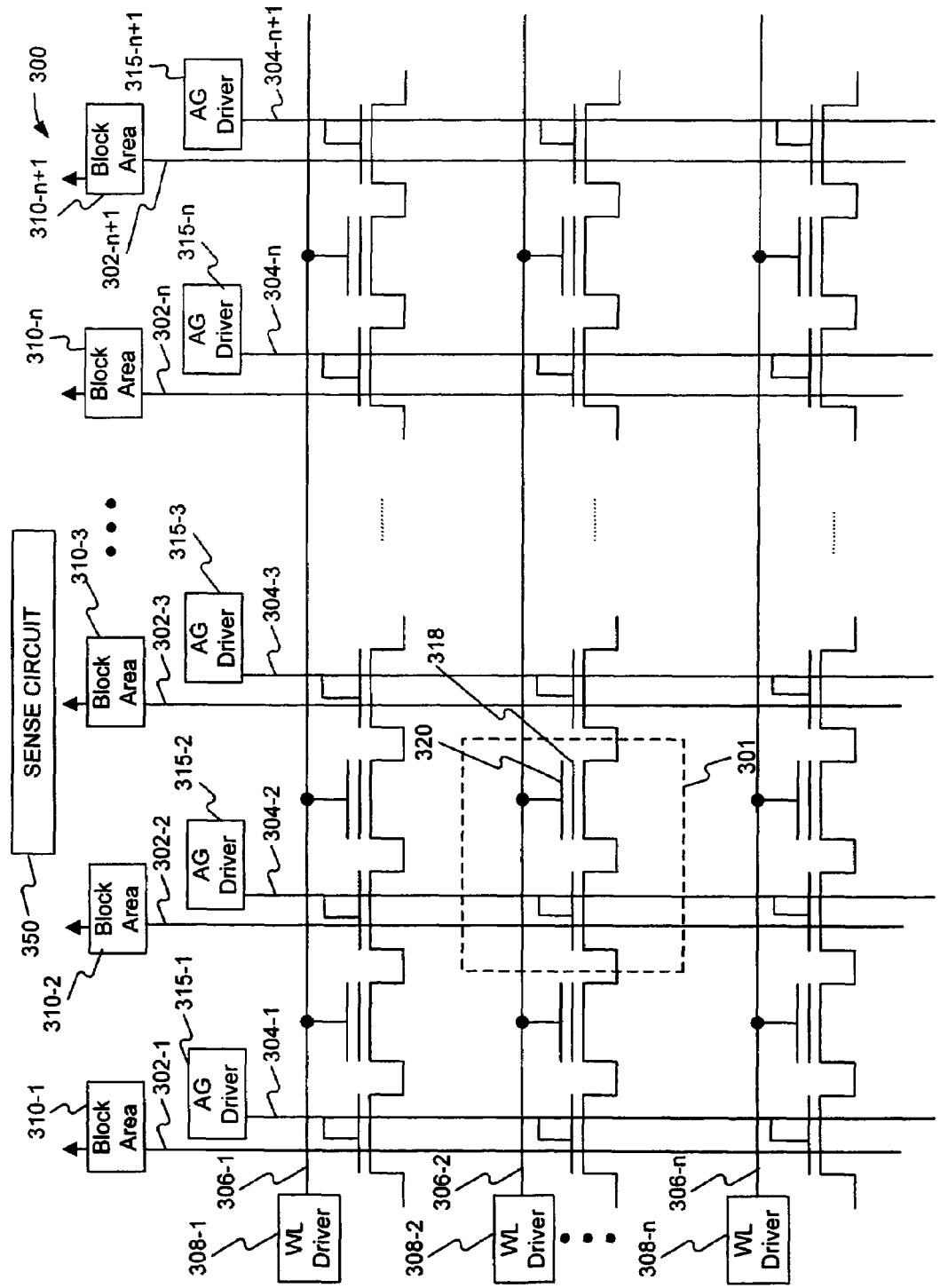
FIG. 3B illustrates a schematic diagram of a memory cell array consistent with a further aspect of the present invention.

FIG. 3B illustrates an array 300 of memory cells or devices 101-1 consistent with an additional aspect of the present invention. Array 300 includes a plurality of word line driver circuits ("WL Driver") 308-1 to 308-n, block areas 310-1 to 310-n+1, and assist gate driver circuits ("AG Driver") 315-1 to 315-n+1. Word lines 306-1 to 306-n are respectively coupled to WL Drivers 308-1 to 308-n, and assist gate lines 304-1 to 304-n+1, corresponding to assist gates 104-1 and 104-2 of each device, e.g., device 101-1, are respectively coupled to AG Drivers 315-1 to 315-n+1. Inversion layers represented by lines 302-1 to 302-n+1 are selectively formed beneath corresponding assist gate lines 304-1 to 304-n+1. The inversion layers are appropriately biased by supplying a potential to respective heavily doped n-type diffusion regions or block areas 310-1 to 310-n+1, which are located adjacent first end portions of each of lines 302-1 to 302-n+1. Each of block areas 310-1 to 310-n+1 is coupled to sense circuit 350 for reading out data from array 300. Additional block areas, each corresponding to a respective one of block areas 310-1 to 310-n+1, may be provided at respective second end portions of each of lines 302-1 to 302-n+1. The additional block areas may be provided to further maintain the biasing of the inversion layers.

Reading data from array 300 will next be described in greater detail with reference to FIG. 3B. In order to select a particular memory cell in array 300, one of WL Drivers 308-1 to 308-n supplies an appropriate bias to a corresponding one of word lines 306-1 to 306-n, thereby designating a particular row of cells of array 300 in which the selected memory cell is located. If a memory cell 301 is to be selected, the appropriate bias is supplied from WL Driver 308-2 to word line 306-2, and thus to the control gates of each memory cell connected to that word line, including a control gate 320 of memory cell 301. FIG. 3B also diagrammatically illustrates a dielectric stack 318 corresponding to dielectric stack 118-1, of device 101-1, constructed as an ONO dielectric stack.

In addition, suitable potentials are supplied to those assist gate lines located adjacent to the floating gate of the selected memory cell. In the present example in which memory cell 301 is to be selected, such potentials are only supplied to assist gate lines 304-2 and 304-3 by AG Drivers 315-2 and 315-3, respectively. The potentials create inversion layers or regions beneath assist gate lines 304-2 and 304-3, as represented by lines 302-2 and 302-3, respectively. Moreover, block area 310-2 is set to a particular voltage, while block area 310-3 is set to ground, for example.

In one embodiment, if charge, in the form of electrons, is present in dielectric stack 318 from a previous write operation, no current path will form beneath control gate 320 because the charge on dielectric stack 318 in effect repels carriers (electrons in this example) and raises the threshold voltage of cell 301 necessary to form a channel between assist gate lines 302-2 and 302-3. The potential of block area 302-2 will thus remain unchanged, which, as detected by sense circuit 350, can be interpreted as a binary "1", for example.

If, however, no charge is present in dielectric stack 318, application of the appropriate bias to word line 306-2 will induce a channel beneath control gate 320. Accordingly, a current path is formed from block area 310-3 to inversion layer 302-3, beneath control gate 320 of selected cell 301, to inversion layer 302-2, and to block area 310-2. Thus, block area 310-2 is electrically connected to block area 310-3, and since block area 310-3 is grounded, the potential on block area 310-2 is pulled to zero volts in this example. Sense circuit 350 can then detect the ground potential on block area 310-2 as a binary "0", for example.

By way of further example, writing data to and erasing data from memory cell 301 in accordance with a first operational mode will next be described in detail with reference to FIGS. 4A and 4B. Reading data from memory cell 301 will be described in greater detail with reference to FIG. 4C.

Figure 4A:
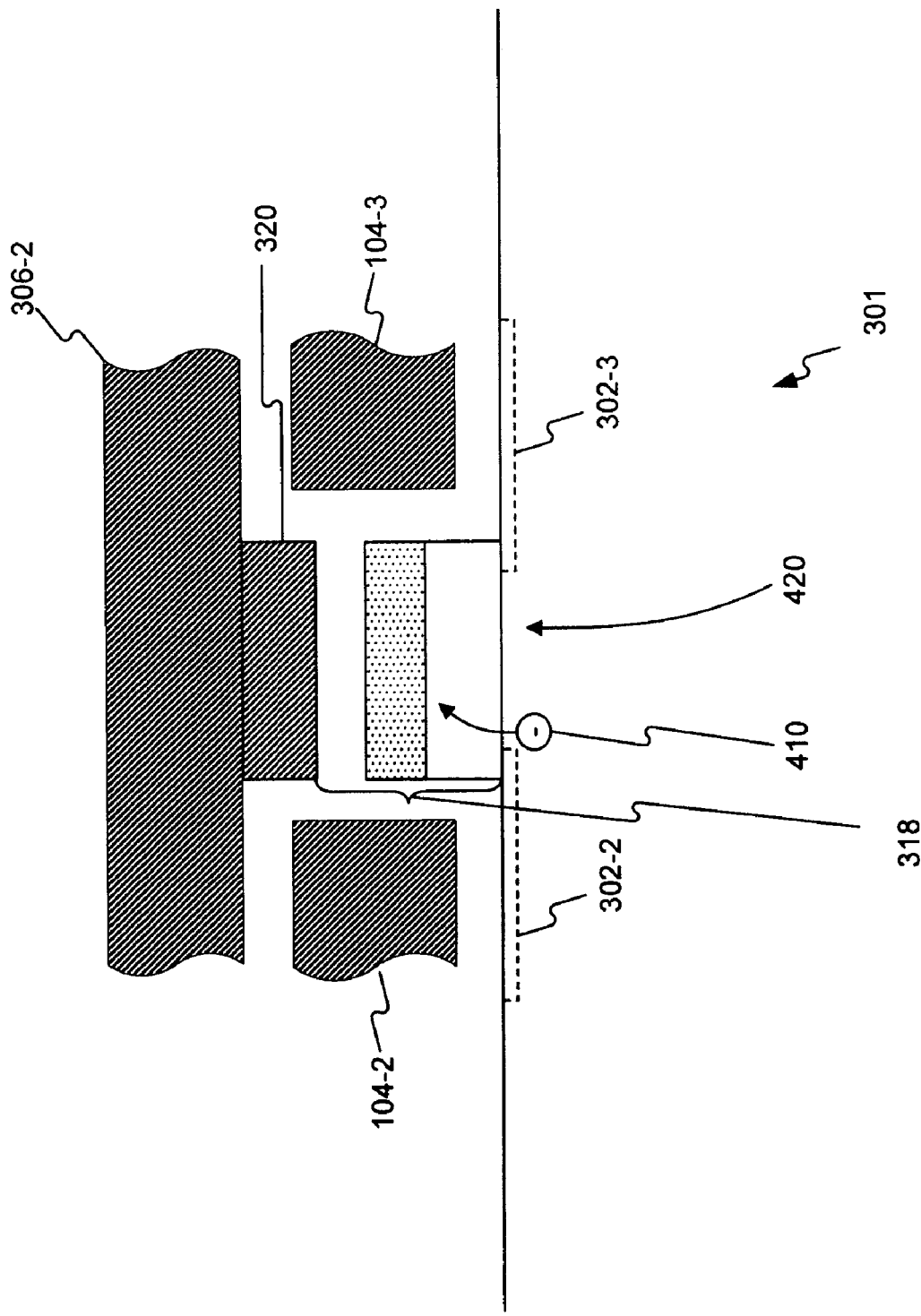
FIGS. 4A-4C illustrate an exemplary mode of operation of a memory cell in accordance with the present invention.
Figure 4B:
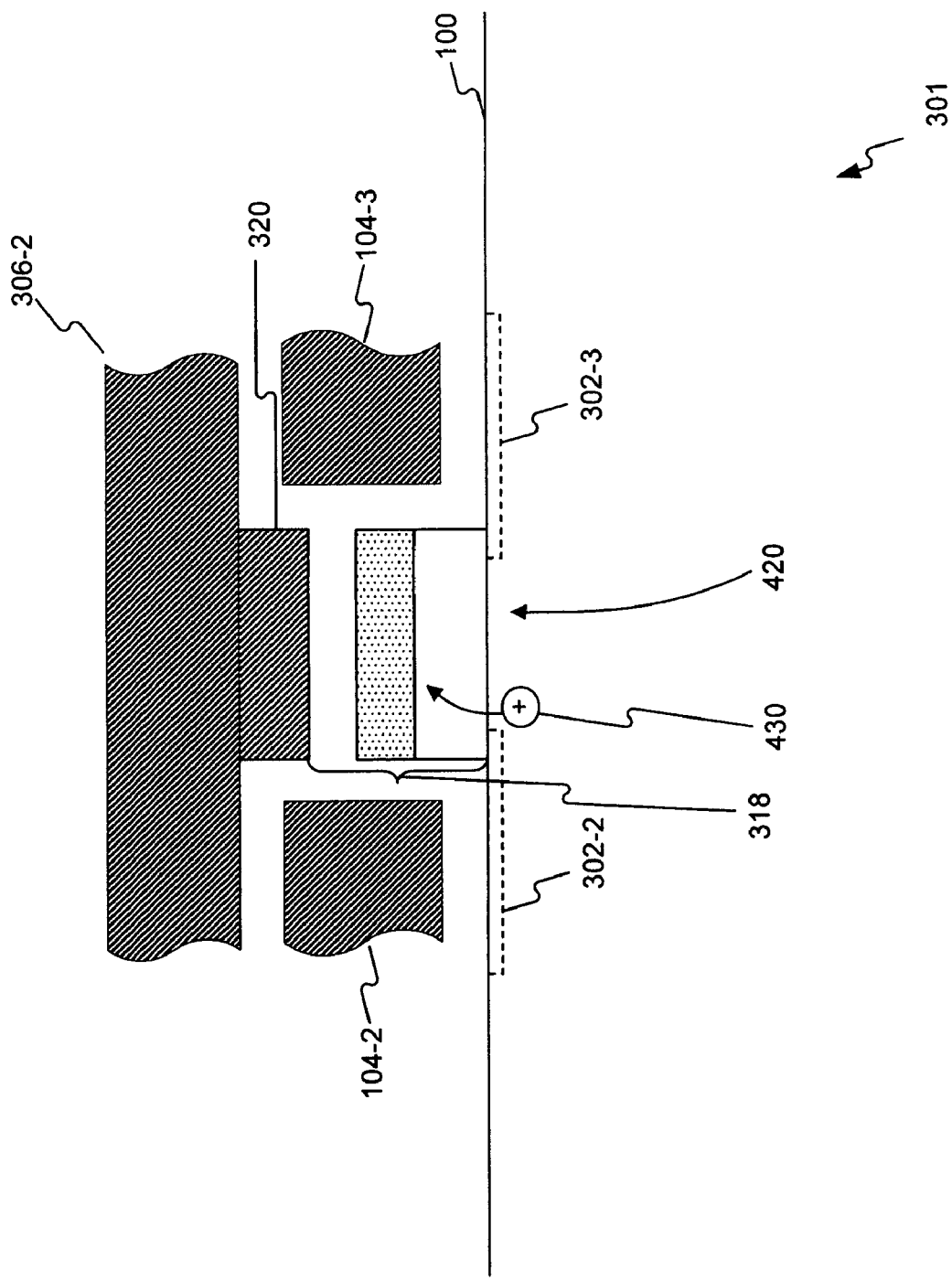

As shown in FIG. 4A, data is written to cell 301 with Channel Hot Electron (CHE) programming by biasing assist gate lines 304-2 and 304-3, and thereby assist gates 104-2 and 104-3, respectively, at 3 V, for example, to form inversions layers 302-2 and 302-3 respectively therebeneath. Block areas 310-2 and 310-3 (FIG. 3B) are held at 0 V and 5 V, respectively, to facilitate current flow between inversion layers 302-2 and 302-3 in a channel region 420. Hot electrons 410, therefore, are introduced into channel region 420 from inversion layers 302-2 and 302-3 upon application of a voltage of 11 V, for example, on word line 306-2. Hot electrons 410 are sufficiently energetic to lodge in dielectric stack 318, thereby programming cell 301 with a "1", for example. A "0" is programmed by not storing charge in dielectric stack 318.

Erasing data from memory cell 301 will next be described with reference to FIG. 4B. During an erase operation, block areas 310-3 and 310-2 are held, for example, at 5 V and 0 V, respectively. Word line 306-2 is set to −5 V, for example, and assist gate lines 304-2 and 304-3 are each biased to 3 V, for example. The −5 V word line potential and the 5 V block area potential facilitate band-to-band tunneling (BTBT), in which highly energetic holes 430 are generated near the surface of substrate 100 adjacent dielectric stack 318. These holes tunnel into dielectric stack 318 to neutralize any electrons stored therein, thereby completing the erase operation. Preferably, the voltages applied to word line 306-2 and block area 302-3 are opposite in polarity in order to generate enough holes with sufficient energy to facilitate the erase operation.

Figure 4C:
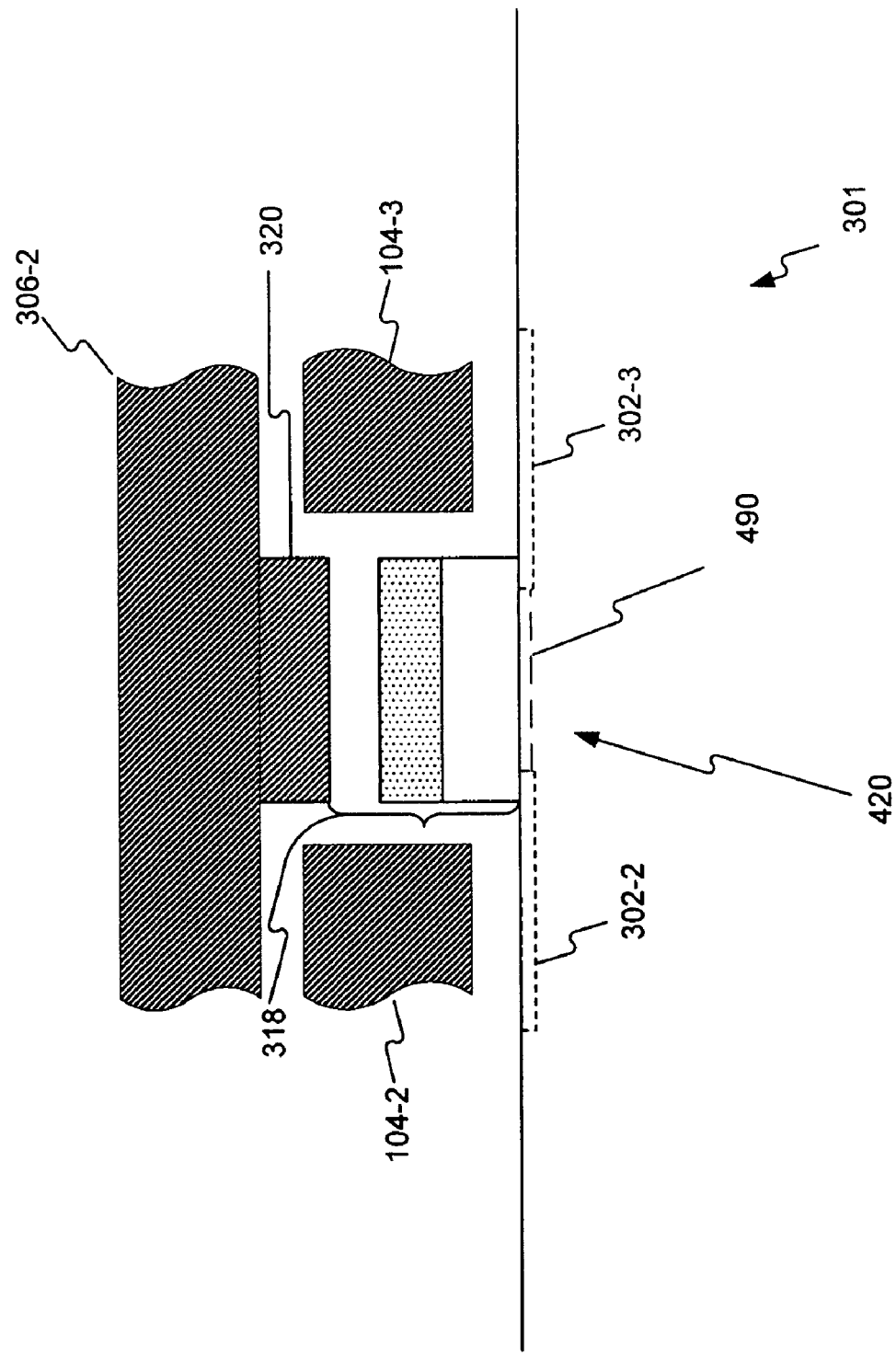

During the read operation of the first mode of operation, as shown in FIG. 4C, the selected word line 306-2 is biased at 3V, a bias that is slightly higher than the threshold voltage of cell 301 without electrons present in dielectric stack 318. Assist gate lines 304-3 and 304-2 are also set to 3V, for example, which generates inversion layers 302-3 and 302-2, respectively, in a manner similar to that described above. Block areas 310-2 and 310-3 are respectively biased at 1.6 and 0V, for example.

As noted above, if electrons are present in dielectric stack 318, current will not flow in channel region 420, and thus block area 310-2 will remain at 1.6 V, representing a "1" for example. If no charge is stored in dielectric stack 318, however, a channel will form in channel region 420 thus completing a current path, which electronically couples inversion layer 302-2, and thus block area 310-2, with inversion layer 302-3 and block area 310-3. The potential of block area 310-2 in this instance will therefore be pulled down to the potential of block area 310-3, thereby representing a "0", for example.

Figure 5:
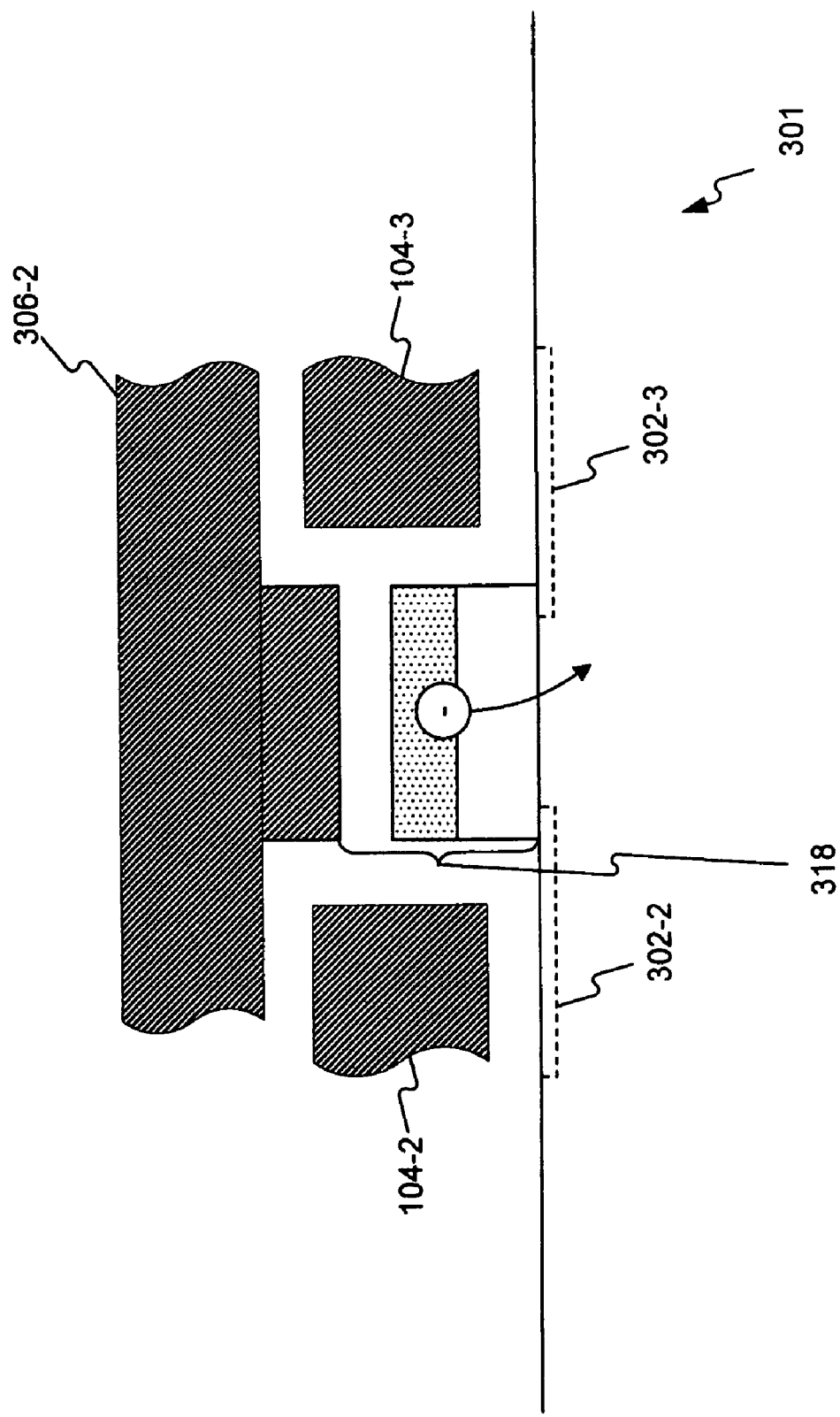
FIG. 5 illustrates an alternative mode of operation of the memory cell consistent with the present invention.

An alternative mode of erasing data from memory cell 301 will next be described with reference to FIG. 5. In the alternative erase mode, −20 V (or +20 V if holes are stored in dielectric stack 318, as discussed below) is applied to the selected word line 306-2, and both assist gate lines 304-2 and 304-3, and thereby assist gates 104-2 and 104-3, respectively, are either both set to 0 V or 3 V. Block areas 310-2 and 310-3 are both set to ground. Under these conditions, so-called Fowler-Nordheim (FN) tunneling occurs whereby electrons tunnel out of dielectric stack 318 to channel region 420, thereby facilitating erasure of cell 301.

In accordance with an alternative mode of writing data to cell 301, the same biases are applied to word line 306-2, assist gate lines 304-2, 304-3, and block areas 310-2, 310-3 as during the erasure process discussed above in connection with FIG. 4B. In this alternative writing mode, however, data is stored as holes in dielectric stack 318. Thus, holes are injected to program or write data to cell 301 instead of to erase data from it. If data is stored as the presence or absence of holes in dielectric stack 318, however, the bias of word line 306-2 may be set to a relatively low value, so that current is induced in channel region 420 only when holes are stored in dielectric stack 318. Accordingly, the presence of holes in dielectric stack 318 facilitates formation of a channel to electrically couple inversion layers 302-2 and 302-3, and the potential on block area 310-2 is thus pulled down to the potential of block area 310-3, in a manner similar to that discussed above. The resulting reduced potential of block area may thus be interpreted as "0", for example. On the other hand, in the absence of such holes, no current is induced in channel region 420, and the potential on block area 310-2 remains unchanged, thereby representing a "1", for example.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a substrate;
   a first conductive layer provided on a first region of the substrate, and being insulated from the first region of the substrate;
   a second conductive layer provided on a second region of the substrate, the first region being spaced from the second region, the second conductive layer being insulated from the second region of the substrate; and
   a dielectric layer provided on a third region of the substrate, the third region being between the first and second regions, the dielectric layer for charge storage comprising a plurality of dielectric materials including a first insulating layer, a second insulating layer, and a third insulating layer, the third insulating layer being surrounded by the first insulating layer and second insulating layer; and
   a third conductive layer provided on the insulating layer, wherein upon application of first, second, and third biases to the first, second, and third conductive layers, respectively, the insulating layer receives and retains the carriers, and
   wherein the first, second, and third conductive layers are respectively a first assist gate line, a second assist gate line, and a word line.

2. A semiconductor device in accordance with claim 1, wherein the first and second conductive layers are configured to induce first and second inversion layers in the first and second regions, respectively.

3. A semiconductor device according to claim 2, further comprising a first, second, and third driver circuits configured to provide first, second and third biases to the first, second and the third conductive layers, respectively.

4. A semiconductor device according to claim 2, further comprising first and second doped regions in the substrate configured to bias the first and second inversion layers, respectively.

5. A semiconductor device in accordance with claim 1, wherein the first insulating layer and the second insulating layer include silicon oxide, and the third insulating layer includes silicon nitride.

6. A semiconductor device according to claim 1, wherein the first, second, and third conductive layers each include polysilicon.

7. A semiconductor device, comprising:
   a substrate;
   a dielectric stack provided on the substrate and configured to retain charge and including:
      a first layer of silicon oxide,
      a second layer of silicon nitride, and
      a third layer of silicon oxide,
      the second layer being surrounded by the first layer and the third layer;
   a first polysilicon layer laterally spaced from the dielectric stack, the first polysilicon layer being insulated from the substrate;
   a second polysilicon layer laterally spaced from the dielectric stack and the first polysilicon layer, the second polysilicon layer being insulated from the substrate; and
   a third polysilicon layer provided on the third silicon oxide layer, the first polysilicon layer and the second polysilicon layer, the third polysilicon layer being insulated from the first and second polysilicon layers, wherein the first polysilicon layer, the second polysilicon layer, and third polysilicon layer are respectively a first assist gate line, a second assist gate line, and a word line.

8. A memory array including a plurality of semiconductor devices, comprising:
a substrate having a surface;
a first assist gate line being insulated from and extending over a first region of the surface of the substrate;
a second assist gate line being insulated from and extending over a second region of the surface of the substrate, the first and second regions being spaced from one another;
an insulating layer being provided on a third region of the surface of the substrate, the third region being between the first and second regions, the insulating layer comprising a plurality of insulating layers including a first insulating layer, a second insulating layer, and a third insulating layer, the third insulating layer being surrounded by the first insulating layer and second insulating layer; and
a word line on the insulating layer,
wherein upon application of first, second, and third biases to the first assist gate line, the second assist gate line, and the word line, respectively, the insulating layer receives carriers, the insulating layer being configured to retain the carriers, and first and second inversion layers are formed adjacent to the first and second assist gate lines, respectively, in response to the first and second biases; and
first and second doped regions provided in the substrate, the first and second doped regions being configured to bias the first and second inversion layers, respectively.

9. A memory array in accordance with claim 8, wherein first and second ones of the plurality of insulating layers include silicon oxide, and a third one of the plurality of insulating layers includes silicon nitride.

10. A memory array according to claim 8, wherein the first assist gate line, the second assist gate line, and the word line comprise polysilicon.

11. A memory array according to claim 8, further comprising first, second, and third driver circuits configured to provide the first, second and third biases, respectively.

12. A method of fabricating a semiconductor device on a substrate surface, comprising:
forming a first insulating layer on a first region of the substrate surface;
forming a second insulating layer on the first insulating layer;
forming a third insulating layer on the substrate and the second insulating layer, the first insulating layer and third insulating layer surrounding the second insulating layer, and the first insulating layer, second insulating layer, and third insulating layer being configured to retain charge;
forming a first conductive layer, on the third insulating layer, laterally spaced from the first and second insulating layers, the first conductive layer being a first assist gate line;
forming a second conductive layer, on the third insulating layer, laterally spaced from the first and second insulating layers, the second conductive layer being a second assist gate line; and
forming a third conductive layer on the third insulating layer, the third conductive layer being a word line.

13. A method for fabricating a semiconductor device according to claim 12, wherein the forming of the first and third insulating layers includes depositing a silicon oxide layer.

14. A method for fabricating a semiconductor device according to claim 12, wherein the forming of the first and third insulating layers includes thermally growing a silicon oxide layer.

15. A method for fabricating a semiconductor device according to claim 14, wherein the first and second conductive layers include polysilicon, the method further including:
oxidizing portions of the first and second conductive layers.

16. A method for fabricating a semiconductor device according to claim 12, wherein the forming of the second insulating layer includes thermally growing a silicon nitride layer.

17. A method for fabricating a semiconductor device according to claim 12, wherein the forming of the second insulating layer includes depositing a silicon nitride layer.

18. A method for fabricating a semiconductor device, comprising:
forming a dielectric stack on a substrate, including
a first layer of silicon oxide,
a second layer of silicon nitride, and
a third layer of silicon oxide,
the first layer and third layer surrounding the second layer, and the first layer, second layer, and third layer being configured to retain charge;
forming a first polysilicon layer laterally spaced from the dielectric stack;
forming a second polysilicon layer laterally spaced from the dielectric stack;
oxidizing portions of the first and second polysilicon layers; and
forming a third polysilicon layer on the dielectric stack and the oxidized portions of the first and second polysilicon layers,
wherein the first polysilicon layer, the second polysilicon layer, and the third polysilicon layer are respectively a first assist gate line, a second assist pate line, and a word line.

* * * * *